(12) United States Patent
Lee et al.

(10) Patent No.: US 10,490,284 B2
(45) Date of Patent: Nov. 26, 2019

(54) MEMORY DEVICE AND OPERATING METHOD THEREOF

(71) Applicant: SK hynix Inc., Gyeonggi-do (KR)

(72) Inventors: Hee Youl Lee, Gyeonggi-do (KR); Kyoung Cheol Kwon, Gyeonggi-do (KR); Dong Hun Lee, Gyeonggi-do (KR); Min Kyu Jeong, Chungcheongbuk-do (KR); Sung Yong Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 4 days.

(21) Appl. No.: 15/926,011

(22) Filed: Mar. 20, 2018

(65) Prior Publication Data

US 2019/0057744 A1 Feb. 21, 2019

(30) Foreign Application Priority Data

Aug. 21, 2017 (KR) .......................... 10-2017-0105686

(51) Int. Cl.
*G11C 11/34* (2006.01)
*G11C 16/14* (2006.01)
*G11C 16/30* (2006.01)
*G11C 16/34* (2006.01)
*G11C 16/10* (2006.01)
*G11C 11/56* (2006.01)
*G11C 16/04* (2006.01)

(52) U.S. Cl.
CPC .............. *G11C 16/14* (2013.01); *G11C 16/10* (2013.01); *G11C 16/30* (2013.01); *G11C 16/3409* (2013.01); *G11C 16/3445* (2013.01); *G11C 11/5635* (2013.01); *G11C 11/5671* (2013.01); *G11C 16/04* (2013.01); *G11C 16/3459* (2013.01)

(58) Field of Classification Search
CPC ..... G11C 16/10; G11C 16/16; G11C 16/3427; G11C 16/08; G11C 16/0483; G11C 11/34
See application file for complete search history.

(56) References Cited

U.S. PATENT DOCUMENTS

| | | | | |
|---|---|---|---|---|
| 8,630,123 | B2 * | 1/2014 | Jeong ...................... | G11C 16/10 |
| | | | | 365/185.19 |
| 8,830,744 | B2 * | 9/2014 | Ahn ........................ | G11C 16/10 |
| | | | | 365/185.03 |
| 9,142,296 | B2 * | 9/2015 | Kim ........................ | G11C 16/06 |
| 9,424,901 | B1 * | 8/2016 | An .......................... | G11C 7/227 |

FOREIGN PATENT DOCUMENTS

KR 1020150063850 6/2015
KR 1020160150501 12/2016

* cited by examiner

*Primary Examiner* — Hien N Nguyen
(74) *Attorney, Agent, or Firm* — IP & T Group LLP

(57) ABSTRACT

The invention is directed to an electronic device. A memory device having improved reliability according to an embodiment includes a memory cell array including a plurality of memory cells, a peripheral circuit performing a program operation on selected memory cells, among the plurality of memory cells, and a control logic controlling the peripheral circuit to perform an additional program operation on memory cells corresponding to a deep erased state where the memory cells has a threshold voltage having a lower voltage level than a threshold voltage of an erase state, among the selected memory cells, after the program operation is completed.

18 Claims, 12 Drawing Sheets

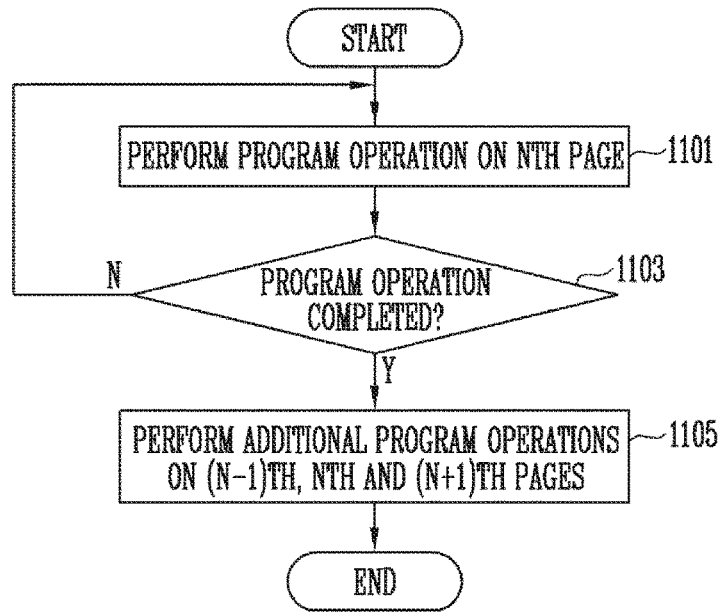
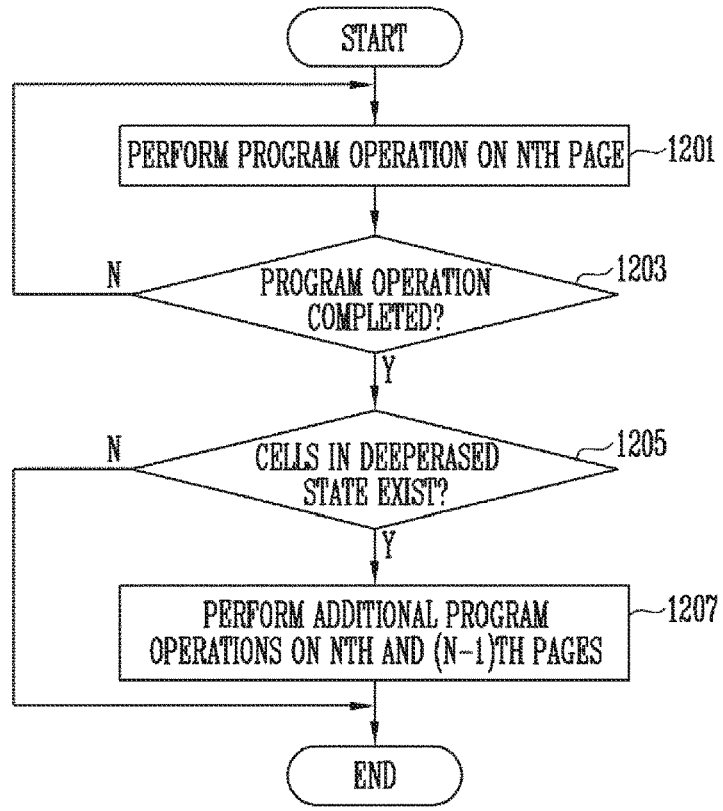

MEMORY DEVICE AND OPERATING METHOD THEREOF

CROSS-REFERENCE TO RELATED APPLICATION

The present application claims priority under 35 U.S.C. § 119(a) to Korean patent application number 10-2017-0105686, filed on Aug. 21, 2017, which is incorporated herein by reference in its entirety.

BACKGROUND

Field of Invention

Various embodiments of the invention relate generally to an electronic device. Particularly, the present disclosure relates to a semiconductor device and an operating method thereof.

Description of Related Art

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Examples of non-volatile memory may include Read Only Memory (ROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM).

SUMMARY

Various embodiments are directed to a memory device having improved reliability and an operating method thereof.

According to an embodiment, a memory device may include a memory cell array including a plurality of memory cells, a peripheral circuit performing a program operation on selected memory cells, among the plurality of memory cells, and a control logic controlling the peripheral circuit to perform an additional program operation on memory cells corresponding to a deep erased state where the memory cells has a threshold voltage having a lower voltage level than a threshold voltage of an erase state, among the selected memory cells, after the program operation is completed.

According to an embodiment, a memory device may include a memory cell array including a plurality of memory cells divided into a plurality of pages, a peripheral circuit performing a program operation on a selected page, among the plurality of pages, and a program operation control unit controlling the peripheral circuit to perform an additional program operation on memory cells corresponding to a deep erased state where the memory cells have a threshold voltage having a lower voltage level than a threshold voltage corresponding to an erase state, the memory cells included in at least one of the plurality of pages, after the program operation is completed.

According to an embodiment, a method of operating a memory device may include performing a program operation on memory cells included in a selected page, among a plurality of memory cells forming a plurality of pages, and performing an additional program operation on memory cells corresponding to a deep erased state where the memory cells have a lower threshold voltage than an erase state, the memory cells included in at least one of the plurality of pages, after the program operation is completed.

BRIEF DESCRIPTION OF THE DRAWINGS

FIG. 11 is a flowchart illustrating a method of operating a memory device according to another embodiment;

FIG. 12 is a flowchart illustrating a method of operating a semiconductor device according to another embodiment;

DETAILED DESCRIPTION

Figure 1:
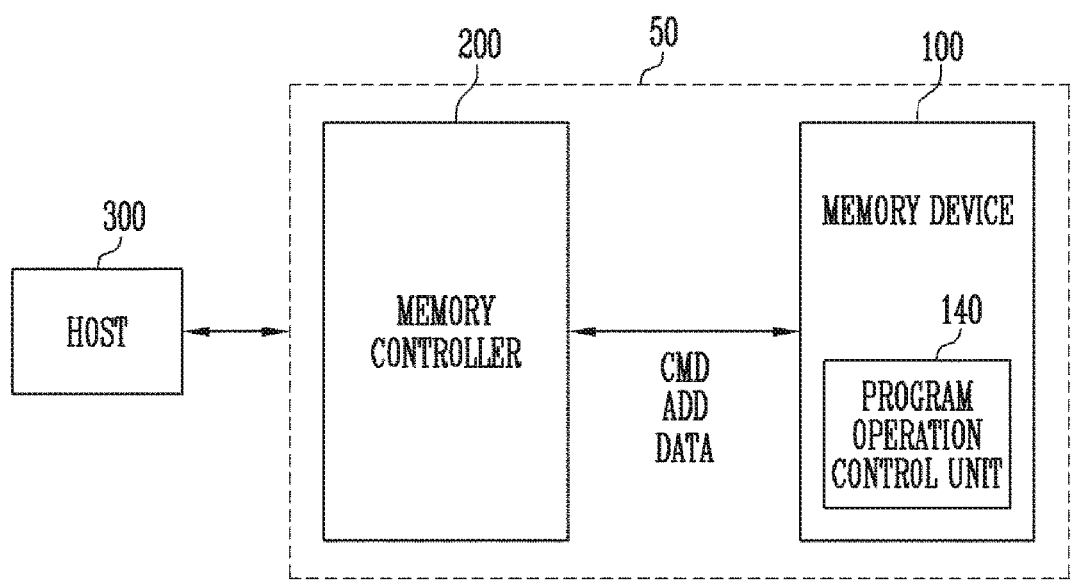
FIG. 1 is a diagram illustrating a storage device including a memory device according to an embodiment of the present disclosure.

Hereinafter, specific structural or functional descriptions of exemplary embodiments in accordance with concepts which are disclosed in this specification are illustrated only to describe the exemplary embodiments in accordance with the concepts and the exemplary embodiments in accordance with the concepts may be carried out by various forms but the descriptions are not limited to the exemplary embodiments described in this specification.

Various modifications and changes may be applied to the exemplary embodiments in accordance with the concepts so that the exemplary embodiments will be illustrated in the drawings and described in the specification. However, the exemplary embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

In some embodiments, well-known processes, device structures, and technologies will not be described in detail to avoid ambiguousness of the present invention.

Hereinafter, the present disclosure will be described by explaining the exemplary embodiments with reference to the accompanying drawings.

FIG. 1 is a diagram illustrating a storage device 50 including a memory device 100 according to an embodiment of the present disclosure.

Referring to FIG. 1, the storage device 50 may include the memory device 100 and a memory controller 200.

The memory device 100 may store data. The memory device 100 may operate in response to control of the memory controller 200. The memory device 100 may include a memory cell array including a plurality of memory cells, which stores data.

The memory cell array may include a plurality of memory blocks, each of which may include a plurality of memory cells. The memory device 100 may store data in the memory blocks in a sequential or random order in response to control the memory controller 200.

According to an embodiment, the memory device 100 may be Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

According to an embodiment, the memory device 100 may have a three-dimensional array structure. The present invention may be applicable to a charge trap flash (CTF) including a charge storage layer formed of an insulating layer as well as a flash memory device including a charge storage layer formed of a floating gate (FG).

The memory device 100 may receive a command CMD, an address ADD, and data DATA from the memory controller 200. The memory device 100 may perform an operation corresponding to the command CMD on an area selected by the address ADD received from the memory controller 200.

For example, the memory device 100 may perform a write operation (program operation), a read operation, and an erase operation. During a program operation, the memory device 100 may program data into the area selected by the address ADD. During a read operation, the memory device 100 may read data from the selected area by the address ADD. During an erase operation, the memory device 100 may erase the data stored in the selected area by the address ADD.

According to an embodiment, the memory device 100 may further include a program operation control unit 140.

Memory blocks included in the memory device 100 may include a plurality of pages. For example, memory cells coupled to one of word lines coupled to a memory block may form a single page.

During a program operation, the memory device 100 may store data in at least one page selected by the received address. The memory device 100 may perform a program operation in a page unit. The memory device 100 may select one of a plurality of pages included in a memory block and perform a program operation to store data in the selected page. After performing the program operation on the selected page, the program operation control unit 140 may perform an additional program operation to control a threshold voltage of memory cells in a deep erased (i.e. over erased) state.

For convenience of explanation, it may be assumed that the selected page is an Nth page, a page programmed previous to the selected page is an (N−1)th page, and a page to be programmed after the selected page is an (N+1)th page. The Nth page may be configured by memory cells coupled to an Nth word line WLn, the (N−1)th page may be configured by memory cells coupled to an (N−1)th word line WLn−1, and the (N+1)th page may be configured by memory cells coupled to the (N+1)th word line WLn+1. According to various embodiments, the (N−1)th, Nth, and (N+1)th word lines may be physically located adjacent to each other in one memory block in a sequential or random manner.

The program operation control unit 140 may control the peripheral circuit 120 to perform an additional program operation on a selected Nth page when a program operation of the selected Nth page is completed.

The additional program operation may be a program operation on memory cells having an erased state as a target program state.

Through the additional program operation, the memory cells having a threshold voltage corresponding to a deep erase state lower than the erased state may be programmed to have a threshold voltage corresponding to the erased state.

According to an embodiment, when the program operation of the selected Nth page is completed, the program operation control unit 140 may perform additional program operations on the selected Nth page and the previous (N−1)th page, which is programmed prior to the selected Nth page. The additional program operations may be performed on the selected Nth page and the previous (N−1)th page simultaneously or sequentially.

According to an embodiment, when the program operation of the selected Nth page is completed, the program operation control unit 140 may perform additional program operations on the selected Nth page, the previous (N−1)th page, and a next (N+1)th page, which is to be programmed subsequent to the selected Nth page. The additional program operations may be performed to the selected Nth page, the previous (N−1)th page, and the next (N+1)th page simultaneously or sequentially.

According to an embodiment, after completion of the program operation on the selected Nth page and before start of the additional program operations, the program operation control unit 140 may additionally perform a verify operation to determine whether there are memory cells corresponding to a deep erased state.

During a verify operation, a deep erase verify voltage Vdeep_verify may be applied to a selected Nth word line WLn. According to a verify result, the program operation control unit 140 may perform the additional program operation only when the memory cells corresponding to the deep erased state exist.

The memory controller 200 may control general operations to the memory device 100. The memory controller 200 may control operations to the memory device 100 in response to or irrespective of a request from the host 300.

For example, the memory controller 200 may control the memory device 100 to perform a program operation, a read operation, or an erase operation at the request from the host 300. During the program operation, the memory controller 200 may provide a program command, a physical address, and data to the memory device 100. During the read operation, the memory controller 200 may provide a read command and a physical address to the memory device 100. During the erase operation, the memory controller 200 may provide an erase command and a physical address to the memory device 100.

According to an embodiment, the memory controller 200 may generate and transfer a program command, an address, and data to the memory device 100 without a request from the host 300. For example, the memory controller 200 may provide the command, the address, and the data to the memory device 100 to perform background operations, such as a program operation for wear leveling and a program operation for garbage collection.

The memory controller 200 may execute firmware (FW) for controlling the memory device 100. When the memory device 100 is a flash memory device, the memory controller 200 may operate firmware such as a flash translation layer (FTL) for controlling communications between the host 300 and the memory device 100. More specifically, the memory controller 200 may provide a logical address included in the request from the host 300 into a physical address, which is the address ADD to be supplied to the memory device 100.

The host 300 may communicate with the storage device 50 by using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM).

Figure 2:
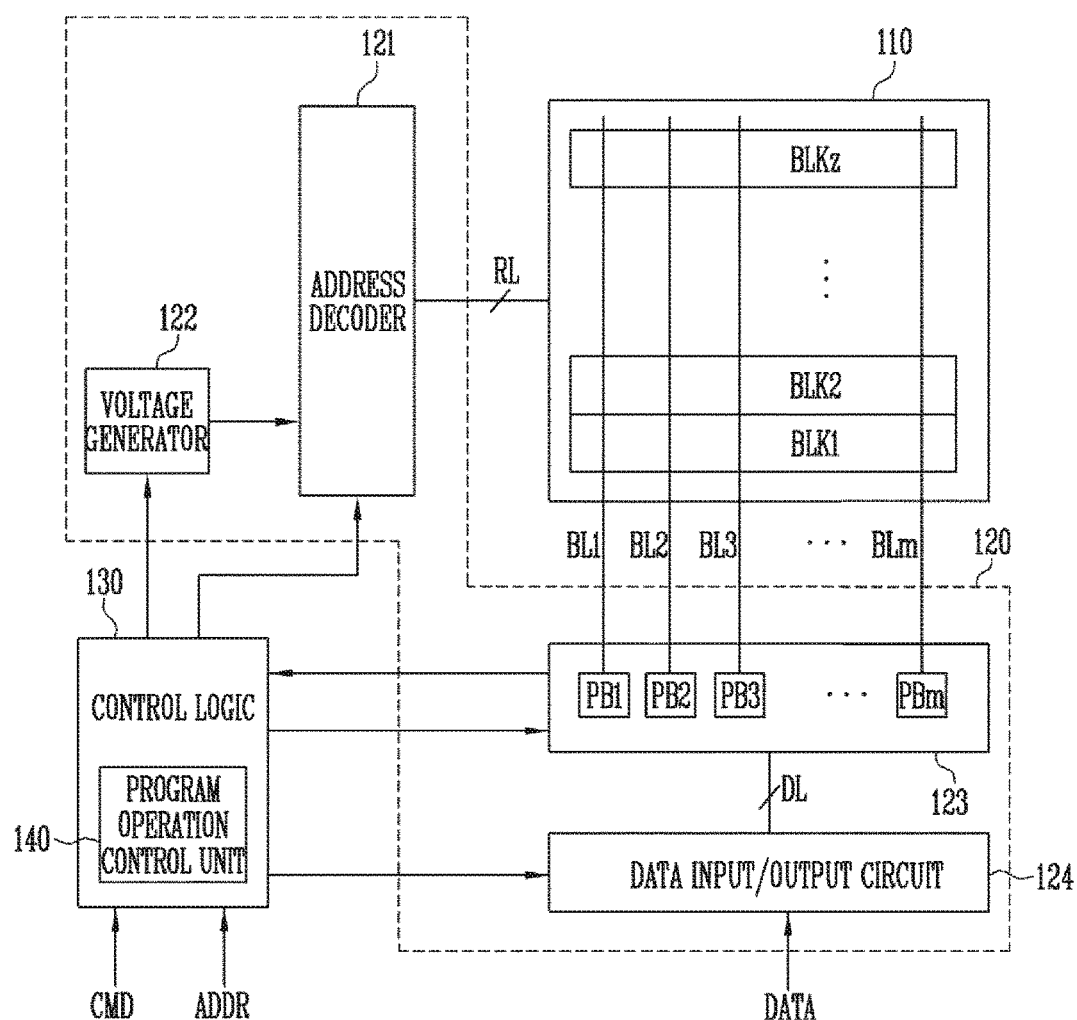
FIG. 2 is a diagram illustrating the structure of a memory device shown in FIG. 1.

FIG. 2 is a diagram illustrating the structure of the memory device 100 shown in FIG. 1.

Referring to FIG. 2, the memory device 100 may include the memory cell array 110, a peripheral circuit 120 and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through bit lines BL1 to BLm. Each of the memory blocks BLK1 to BLKz may include a plurality of memory cells. According to an embodiment, the plurality of memory cells may be non-volatile memory cells. Memory cells coupled to the same word line, among the plurality of memory cells, may be defined as a single page. In other words, the memory cell array 110 may include a plurality of pages. According to an embodiment, each of the memory blocks BLK1 to BLKz included in the memory cell array 110 may include a plurality of dummy cells. One or more of the dummy cells may be coupled in series between a drain selection transistor and memory cells and between a source selection transistor and the memory cells.

The memory cells of the memory device 100 may include a single level cell (SLC) storing a single data bit, a multi level cell (MLC) storing two data bits, a triple level cell (TLC) storing three data bits, and a quad level cell (QLC) storing four data bits.

The peripheral circuit 120 may include the address decoder 121, a voltage generator 122, the read and write circuit 123, and a data input/output circuit 124.

The peripheral circuit 120 may drive the memory cell array 110. For example, the peripheral circuit 120 may drive the memory cell array 110 to perform a program operation, a read operation, and an erase operation.

The address decoder 121 may be coupled to the memory cell array 110 through the row lines RL. The row lines RL may include drain selection lines, word lines, source selection lines, and a common source line. According to an embodiment, the word lines may include normal word lines and dummy word lines. According to an embodiment, the row lines RL may further include a pipe selection line.

The address decoder 121 may operate in response to control of the control logic 130. The address decoder 121 may receive the address ADDR from the control logic 130.

The address decoder 121 may decode a block address of the received address ADDR. The address decoder 121 may select at least one memory block, among the memory blocks BLK1 to BLKz, according to the decoded block address. The address decoder 121 may decode a row address of the received address ADDR. The address decoder 121 may apply voltages provided from the voltage generator 122 to at least one word line of a selected memory block to at least one word line WL according to the decoded row address.

During a program operation, the address decoder 121 may apply a program voltage to a selected word line and a pass voltage having a lower voltage level than the program voltage to unselected word lines. During a program verify operation, the address decoder 121 may apply a verify voltage to the selected word line and a verify pass voltage greater than the verify voltage to unselected word lines.

During a read operation, the address decoder 121 may apply a read voltage to the selected word line and a higher read pass voltage than the read voltage to the unselected word lines.

According to an embodiment, an erase operation may be performed to the memory device 100 in units of memory blocks. During the erase operation, the address ADDR input to the memory device 100 may include a block address. The address decoder 121 may decode the block address and select one memory block according to the decoded block address. During the erase operation, the address decoder 121 may apply a ground voltage to word lines coupled to the selected memory block.

According to an embodiment, the address decoder 121 may decode a column address of the transferred address ADDR. A decoded column address DCA may be transferred to the read and write circuit 123. For example, the address decoder 121 may include components such as a row decoder, a column decoder, and an address buffer.

The voltage generator 122 may generate a plurality of voltages by using an external power voltage supplied to the memory device 100. The voltage generator 122 may operate in response to control of the control logic 130.

According to an embodiment, the voltage generator 122 may generate an internal power voltage by regulating the external power voltage. The internal power voltage generated by the voltage generator 122 may be used as an operating voltage of the memory device 100.

According to an embodiment, the voltage generator 122 may generate a plurality of voltages by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of selected read voltages, and a plurality of unselected read voltages.

According to an embodiment, the voltage generator 122 may generate an additional program voltage applied to perform an additional program operation. The additional program voltage may be applied to program memory cells having a threshold voltage corresponding to a deep erased state so as to have a threshold voltage corresponding to an erased state. In other words, the memory cells may have the threshold voltage corresponding to the deep erased state lower than the threshold voltage corresponding to the erased state by a high erase voltage. The additional program voltage may be a program voltage, which is applied to program memory cells having a threshold voltage corresponding to a deep erased state to have a threshold voltage corresponding to an erased state having a higher voltage level than the threshold voltage corresponding to the deep erased state. According to an embodiment, the additional program voltage may have a single fixed voltage level.

The voltage generator 122 may include a plurality of pumping capacitors receiving the internal power voltage to generate a plurality of voltages having various voltage levels, and generate a plurality of voltages by selectively activating the plurality of pumping capacitors in response to control of the control logic 130.

The generated voltages may be supplied to the memory cell array 110 by the address decoder 121.

The read and write circuit 123 may include first to mth page buffers PB1 to PBm. Each of the first to mth page buffers PB1 to PBm may be coupled to the memory cell array 110 through each of the respective first to mth bit lines BL1 to BLm. The first to mth page buffers PB1 to PBm may operate in response to control of the control logic 130.

The first to mth page buffers PB1 to PBm may communicate data with the data input/output circuit 124. During a program, the first to mth page buffers PB1 to PBm may receive data DATA to be stored through the data input/output circuit 124 and data lines DL.

During a program operation, the first to mth page buffers PB1 to PBm may transfer the data DATA received through the data input/output circuit 124 to the selected memory cells through the respective bit lines BL1 to BLm when a program pulse is applied to the selected word line. Memory cells of a selected page may be programmed according to the transferred data DATA. More specifically, a memory cell coupled to a bit line to which a program permission voltage (e.g., a ground voltage) is applied may have an increased threshold voltage. A threshold voltage of a memory cell coupled to a bit line to which a program inhibition voltage (e.g., a power voltage) is applied may be maintained. During a program verify operation, the first to mth page buffers PB1 to PBm may read data stored in the selected memory cells through the respective bit lines BL1 to BLm.

During a read operation, the read and write circuit 123 may read the data DATA from the memory cells of the selected page through the bit lines BL and output the read data DATA to the data input/output circuit 124.

During an erase operation, the read and write circuit 123 may float the bit lines BL. According to an embodiment, the read and write circuit 123 may include a column selection circuit.

The data input/output circuit 124 may be coupled to the first to mth page buffers PB1 to PBm trough the data lines DL. The data input/output circuit 124 may operate in response to control of the control logic 130.

The data input/output circuit 124 may include a plurality of input/output buffers (not illustrated), which may receive inputted data. During a program operation, the data input/output circuit 124 may receive the data DATA to be stored from an external controller (not illustrated). During a read operation, the data input/output circuit 124 may output the data transferred from the first to mth page buffers PB1 to PBm included in the read and write circuit 123 to the external controller.

The control logic 130 may be coupled to the address decoder 121, the voltage generator 122, the read and write circuit 123, and the data input/output circuit 124. The control logic 130 may control the general operations of the memory device 100. The control logic 130 may operate in response to the command CMD transferred from an external device. According to an embodiment, the address ADDR received by the control logic 130 may be the same as the address ADD described with reference to FIG. 1.

According to an embodiment of the invention, the control logic 130 may further include the program operation control unit 140.

The program operation control unit 140 may control a program operation of the memory device 100.

During the program operation, the program operation control unit 140 may receive a program command, an address, and data from an external controller (not illustrated). The program operation control unit 140 may control the peripheral circuit 120 to perform a program operation on at least one page corresponding to the address.

The program operation control unit 140 may control the peripheral circuit 120 to perform a program operation on a selected page defined by memory cells coupled to a selected word line in at least one page. The program operation may be performed on the selected page to increase a threshold voltage of the memory cells coupled to the selected word line so that each of the memory cells may have one of a plurality of program states divided on the basis of threshold voltages as a target program state.

According to an embodiment, when a memory cell is a single level cell (SLC), a plurality of program states may be an erased state and a first program state PV1. When a memory cell is a multi level cell (MLC), the plurality of program states may be an erased state and first to third program states PV1 to PV3. When a memory cell is a triple level cell (TLC), the plurality of program states may be an erased state and first to seventh program state PV1 to PV7. When a memory cell is a quad level cell (QLC), the plurality of program states may be an erased state and first to 15th program state PV1 to PV15. The program operation on the selected page will be described in more detail with reference to FIG. 7.

For convenience of explanation, it may be assumed that a selected page is an Nth page, a page programmed previous to the selected page is an (N−1)th page, and a page to be programmed subsequent to the selected page is an (N+1)th page. The Nth page may be configured by memory cells coupled to the Nth word line WLn, the (N−1)th page may be configured by memory cells coupled to the (N−1)th word line WLn−1, and the (N+1)th page may be configured by memory cells coupled to the (N+1)th word line WLn+1. According to various embodiments, the (N−1), Nth, and (N+1)th word lines may be physically located adjacent to each other in a single memory block in a sequential or random manner.

The program operation control unit 140 may control the peripheral circuit 120 to perform an additional program operation on the selected Nth page when the program operation on the selected Nth page is completed.

The additional program operation may be performed on memory cells having an erased state as a target program state.

During the additional program operation, the program operation control unit 140 may control the peripheral circuit 120 to apply an additional program voltage to the Nth word line. According to an embodiment, the program operation control unit 140 may control the peripheral circuit 120 to apply the additional program voltage to the Nth word line at least once.

Through the additional program operation, the memory cells having a threshold voltage corresponding to a deep erased state lower than a threshold voltage corresponding to the erased state may be programmed to have the threshold voltage corresponding to the erase state.

The program operation control unit 140 may control the peripheral circuit 120 to apply a program permission voltage (e.g., 0V) to bit lines coupled to the memory cells having the threshold voltage corresponding to the erase state, among memory cells coupled to the selected word line, when the additional program voltage is applied to the selected word line. The program operation control unit 140 may control the peripheral circuit 120 to apply a program inhibition voltage (e.g., power voltage) to bit lines coupled to memory cells having another program state, except for the erased state, as a target program state. According to various embodiments, the program operation control unit 140 may control the peripheral circuit 120 to apply a program permission voltage to bit lines coupled to the memory cells coupled to the selected word line when the additional program voltage is applied to the selected word line.

According to an embodiment, when the program operation of the selected Nth page is completed, the program operation control unit 140 may control the peripheral circuit 120 to perform additional program operations on the selected Nth page and the previous (N−1)th page, which is programmed prior to the selected Nth page. The additional program operations may be performed to the selected Nth page and the previous (N−1)th page simultaneously or sequentially. When the additional program operations are performed to the selected Nth page and the previous (N−1)th page programmed prior to the selected Nth page at the same time, the program operation control unit 140 may control the peripheral circuit 120 to apply a program permission voltage to bit lines coupled to memory cells included in the selected Nth page and the previous (N−1)th page programmed prior to the selected Nth page.

According to an embodiment, the program operation control unit 140 may control the peripheral circuit 120 to perform additional program operations on the selected Nth page, the previous (N−1)th page programmed prior to the selected Nth page, and the next (N+1)th page to be programmed subsequent to the selected Nth page when the program operation of the selected Nth page is completed.

The additional program operations may be performed on the selected Nth page, the previous (N−1)th page programmed prior to the selected Nth page, and the next (N+1)th page to be programmed subsequent to the selected Nth page simultaneously or sequentially. When the additional program operations are performed to the selected Nth page, the previous (N−1)th page programmed prior to the selected Nth page and the next (N+1)th page to be programmed subsequent to the selected Nth page at the same time, the program operation control unit 140 may control the peripheral circuit 120 to perform a program permission voltage to bit lines coupled to memory cells included in the selected Nth page, the previous (N−1)th page programmed prior to the selected Nth page, and the next (N+1)th page to be programmed subsequent to the selected Nth page.

According to an embodiment, after completion of the program operation on the selected Nth page and before start of the additional program operations, the program operation control unit 140 may additionally perform a verify operation to determine whether there are memory cells corresponding to a deep erased state.

During a verify operation, the deep erase verify voltage Vdeep_verify may be applied to a selected Nth word line. According to a verify result, the program operation control unit 140 may perform the additional program operation only when the memory cells corresponding to a deep erased state exist.

The additional program operation of the memory device 100 according to an embodiment will be described in more detail with reference to FIGS. 8 to 13 to be described below.

Figure 3:
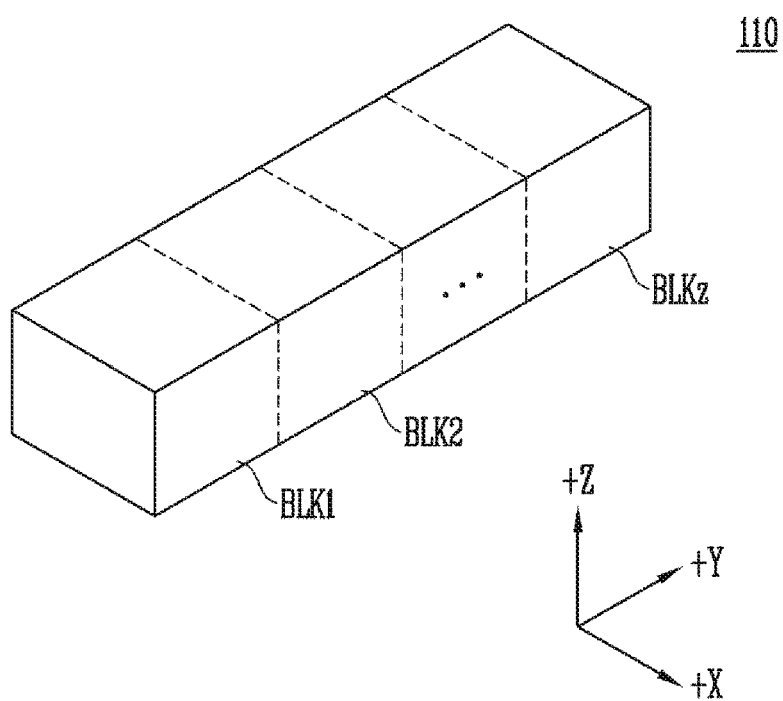
FIG. 3 is a diagram illustrating an embodiment of a memory cell array shown in FIG. 2.

FIG. 3 shows an embodiment of the memory cell array 110 shown in FIG. 2.

Referring to FIG. 3, the memory cell array 110 may include the memory blocks BLK1 to BLKz. Each of the memory blocks may have a three-dimensional structure. Each memory block may include a plurality of memory cells stacked over a substrate. The plurality of memory cells may be arranged in a +X direction, a +Y direction, and a +Z direction. The structure of each memory block will be described in more detail with reference to FIGS. 4 and 5.

Figure 4:
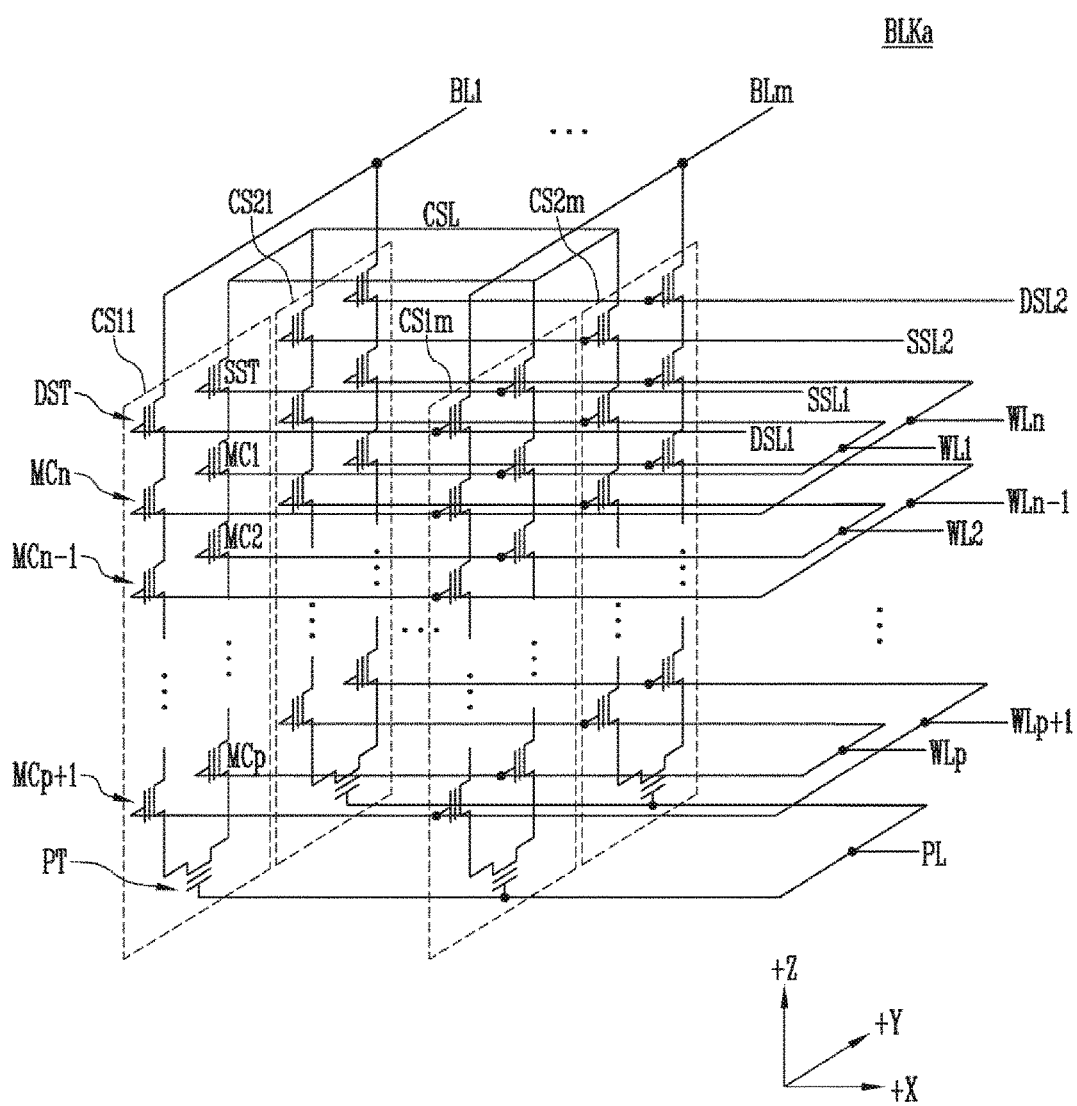
FIG. 4 is a circuit diagram illustrating one (BLKa) of memory blocks BLK1 to BLKz shown in FIG. 3.

FIG. 4 is a circuit diagram illustrating a memory block BLKa, among the memory blocks BLK1 to BLKz shown in FIG. 3.

Referring to FIG. 4, the memory block BLKa may include a plurality of cell strings CS11 to CS1m and CS21 to CS2m. According to an embodiment, each of the cell strings CS11 to CS1m and CS21 to CS2m may be formed into a 'U' shape. In the memory block BLKa, 'm' cell strings may be arranged in the row direction (i.e., +X direction). For convenience of explanation, as shown in FIG. 4, two cell strings may be arranged in a column direction (i.e., +Y direction). However, three or more cell strings may be arranged in the column direction.

Each of the cell strings CS11 to CS1m and CS21 to CS2m may include at least one source selection transistor SST, first to nth memory cells MC1 to MCn, a pipe transistor PT, and at least one drain selection transistor DST.

The selection transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer, and a blocking insulating layer. According to an embodiment, a pillar for providing a channel layer may be provided to each cell string. According to an embodiment, a pillar for providing at least one of a channel layer, a tunneling insulating layer, a charge storage layer, and a blocking insulating layer may be provided to each cell string.

The source selection transistor SST of each cell string may be coupled between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 4, source selection transistors of the cell strings CS11 to CS1m in the first row may be coupled to a first source selection line SSL1. Source selection transistors of the cell strings CS21 to CS2m in the second row may be coupled to a second source selection line SSL2.

According to another embodiment, source selection transistors of the cell strings CS11 to CS1m and CS21 to CS2m may be coupled in common to a single source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be arranged sequentially in a reverse direction to the +Z direction, and coupled in series between the source selection transistor SST and the pipe transistor PT. The (p+1)th to nth memory cells MCp+1 to MCn may be sequentially arranged in the +Z direction, and coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to n-th word lines WL1 to WLn, respectively.

A gate of the pipe transistor PT of each cell string may be coupled to a pipe line PL.

The drain selection transistor DST of each cell string may be coupled between a corresponding bit line and the memory cells MCp+1 to MCn. Cell strings arranged in a row direction may be coupled to a drain selection line extending in the row direction. Drain selection transistors of the cell strings CS11 to CS1m in a first row may be coupled to a first drain selection line DSL1. Drain selection transistors of the cell strings CS21 to CS2m in a second row may be coupled to a second drain selection line DSL2.

Cell strings arranged in a column direction may be coupled to a bit line extending in the column direction. In FIG. 3, the cell strings CS11 and CS21 in a first column may be coupled to the first bit line BL1. The cell strings CS1m and CS2m in an mth column may be coupled to the mth bit line BLm.

Memory cells coupled to the same word line in cell strings arranged in the row direction may form a single page. For example, memory cells coupled to the first word line WL1 in the cell strings CS11 to CS1m in the first row may form a single page. Memory cells coupled to the first word line WL1 in the cell strings CS21 to CS2m in the second row may form another page. When one of the drain selection lines DSL1 and DSL2 is selected, cell strings arranged in the row direction may be selected. When one of the word lines WL1 to WLn is selected, one page may be selected from selected cell strings.

According to another embodiment of the present disclosure, even bit lines and odd bit lines may replace the first to mth bit lines BL1 to BLm. In addition, even cell strings of the cell strings CS11 to CS1m or CS21 to CS2m arranged in the row direction may be coupled to even bit lines, and odd cell strings of the cell strings CS11 to CS1m or CS21 to CS2m arranged in the row direction may be coupled to odd bit lines, respectively.

According to an embodiment, at least one of the first to nth memory cells MC1 to MCn may serve as a dummy memory cell. For example, at least one dummy memory cell may be provided to reduce electric fields between the source selection transistor SST and the memory cells MC1 to MCp. Alternatively, at least one dummy memory cell may be provided to reduce electric fields between the drain selection transistor DST and the memory cells MCp+1 to MCn. When the number of dummy memory cells increases, operational reliability of the memory block BLKa may increase, and the size of the memory block BLKa may increase. On the other hand, when the number of dummy memory cells decreases, the size of the memory block BLKa may be reduced, and the operational reliability of the memory block BLKa may be degraded.

To efficiently control at least one dummy memory cell, each dummy memory cell may have a required threshold voltage. Before or after an erase operation on the memory block BLKa, program operations may be performed on a portion or entirety of the dummy memory cells. When an erase operation is performed after a program operation, dummy memory cells may have required threshold voltages by controlling a voltage applied to dummy word lines coupled to the dummy memory cells.

Figure 5:
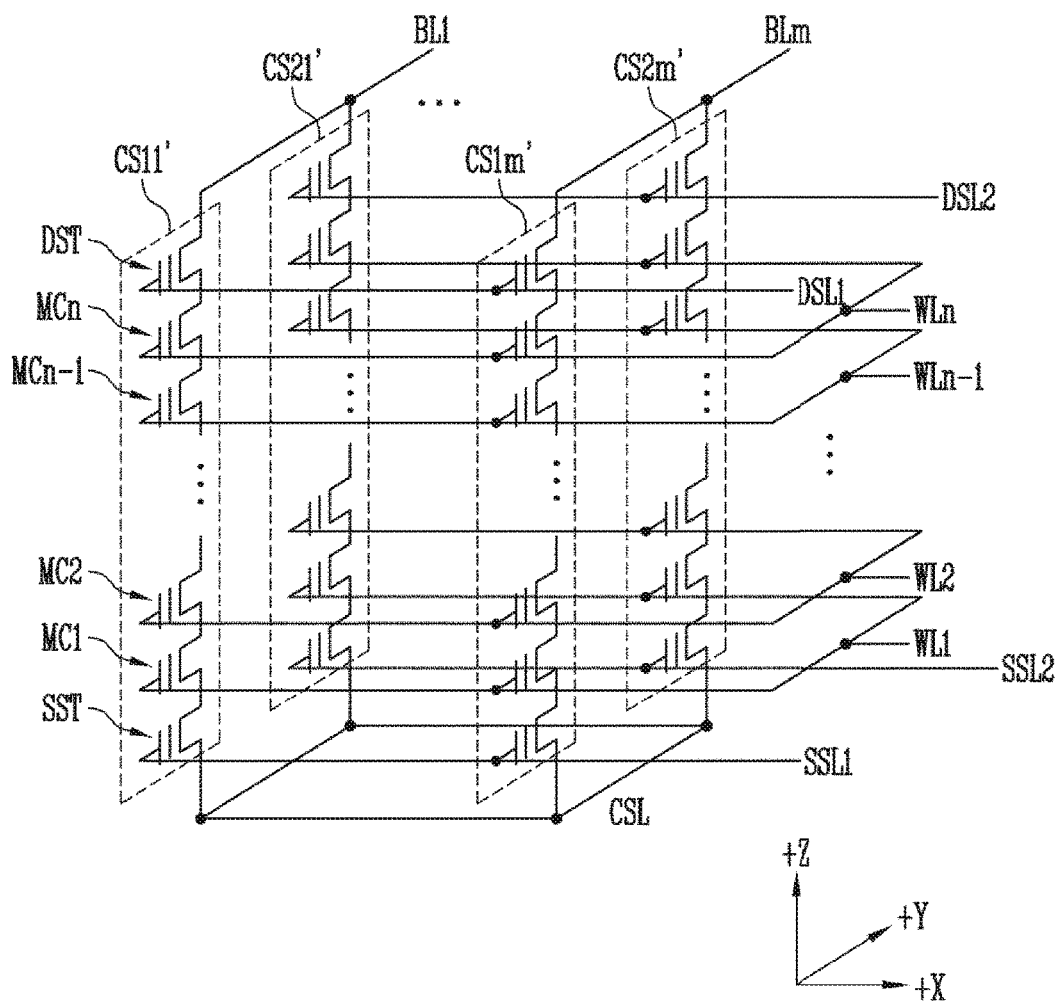
FIG. 5 is a circuit diagram illustrating another embodiment of one (BLKb) of memory blocks BLK1 to BLKz shown in FIG. 3.

FIG. 5 is a circuit diagram illustrating another embodiment of a memory block BLKb, among the memory blocks BLK1 to BLKz shown in FIG. 3.

Referring to FIG. 5, the memory block BLKb may include a plurality of cell strings CS11' to CS1m' and CS21' to CS2m'. The cell strings CS11' to CS1m' and CS21' to CS2m' may extend in +Z direction. Each of the cell strings CS11' to CS1m' and CS21' to CS2m' may include at least one source selection transistor SST, the first to nth memory cells MC1 to MCn, and at least one drain selection transistor DST, all of which are stacked over a substrate (not illustrated) under a memory block BLK1'.

The source selection transistor SST of each cell string may be coupled between the common source line CSL and the memory cells MC1 to MCn. Source selection transistors of cell strings arranged in the same row may be coupled to the same source selection line. Source selection transistors of the cell strings CS11' to CS1m' arranged in the first row may be coupled to the first source selection line SSL1. Source selection transistors of the cell strings CS21' to CS2m' arranged in the second row may be coupled to the second source selection line SSL2. According to another embodiment of the present disclosure, source selection transistors of the cell strings CS11' to CS1m' and CS21' to CS2m' may be coupled in common to a single source selection line.

The first to nth memory cells MC1 to MCn of each cell string may be coupled in series between the source selection transistor SST and the drain selection transistor DST. Gates of the first to nth memory cells MC1 to MCn may be coupled to the first to n-th word lines WL1 to WLn.

The drain selection transistor DST of each cell string may be coupled between a corresponding bit line and the memory cells MC1 to MCn. Drain selection transistors of cell strings arranged in a row direction may be coupled to a drain selection line extending in the row direction (i.e., +X direction). Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

According to another embodiment of the present disclosure, even bit lines and odd bit lines may replace the first to mth bit lines BL1 to BLm. Even cell strings of the cell strings CS11' to CS1m' or CS21' to CS2m' arranged in the row direction may be coupled to even bit lines, respectively, and odd cell strings of the cell strings CS11' to CS1m' or CS21' to CS2m' arranged in the row direction may be coupled to odd bit lines, respectively.

According to an embodiment, at least one of the first to nth memory cells MC1 to MCn may serve as a dummy memory cell. For example, at least one dummy memory cell may be provided to reduce electric fields between the source selection transistor SST and the memory cells MC1 to MCn. Alternatively, at least one dummy memory cell may be provided to reduce electric fields between the drain selection transistor DST and the memory cells MC1 to MCn. When more dummy memory cells are provided, operational reliability of the memory block BLKb may be improved, and the size of the memory block BLKb may increase. When fewer dummy memory cells are provided, the size of the memory block BLKb may be reduced and the operational reliability of the memory block BLKb may be degraded.

To efficiently control at least one dummy memory cell, each of the dummy memory cells may have a required threshold voltage. Before or after an erase operation on the memory block BLKb, program operations may be performed on a portion or entirety of the dummy memory cells. When an erase operation is performed after a program operation is performed, dummy memory cells may have required threshold voltages by controlling a voltage applied to dummy word lines coupled to the dummy memory cells.

Figure 6:
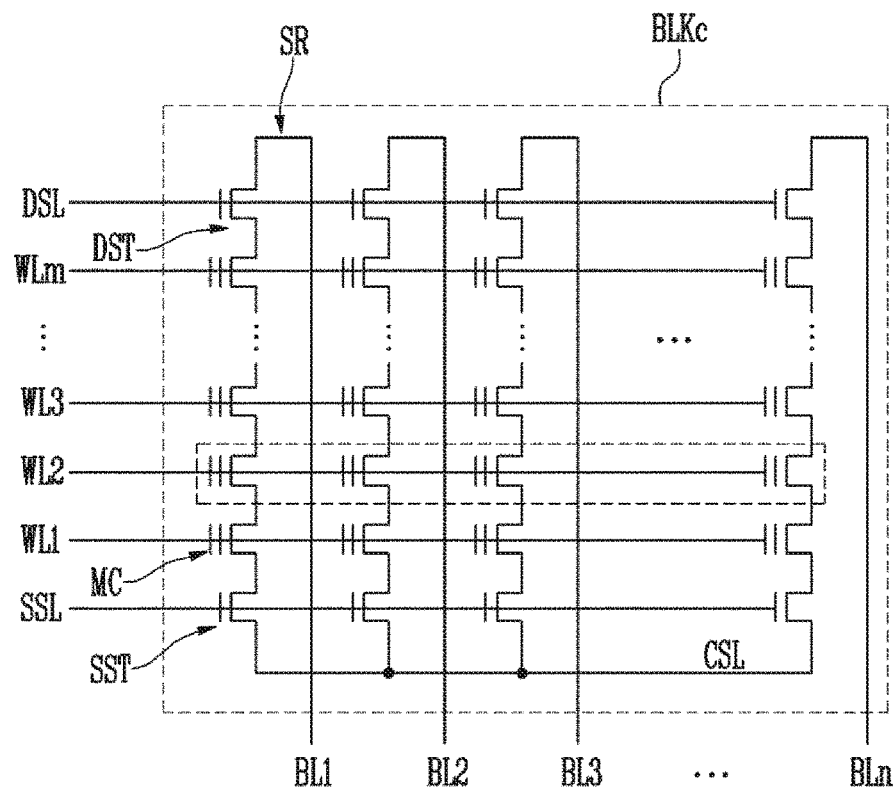
FIG. 6 is a circuit diagram illustrating an embodiment of one (BLKc) of a plurality of memory blocks included in a memory cell array shown in FIG. 2.

FIG. 6 is a circuit diagram illustrating an embodiment of a memory block BLKc, which is one of the memory blocks BLK1 to BLKz included in the memory cell array 110 shown in FIG. 2.

Referring to FIG. 6, the memory block BLKc may include a plurality of cell strings SR. The plurality of cell strings SR may be coupled to the plurality of bit lines BL1 to BLm, respectively. Each of the cell strings SR may include at least one source selection transistor SST, the first to nth memory cells MC1 to MCn, and at least one drain selection transistor DST.

The source selection transistor SST of each string SR may be coupled between memory cells MC and the common source line CSL. The source selection transistors SST of the cell strings SR may be commonly coupled to the common source line CSL.

The drain selection transistor DST of each of the cell string SR may be coupled between the memory cells MC and the bit line BL. The drain selection transistors DST of the plurality of cell strings SR may be coupled to bit lines BL1 to BLn.

In each of the cell string SR, the plurality of memory cells MC may be provided between the source selection transistor SST and the drain selection transistor DST. In each of the cell string SR, the plurality of memory cells MC may be coupled in series.

In the plurality of cell strings SR, the memory cells MC located in the same distance from the common source line CSL may be commonly coupled to a single word line. The memory cells MC of the plurality of cell strings SR may be coupled to a plurality of word lines WL1 to WLm.

In the memory block BLKc, the memory cells MC may be erased in units of memory blocks. When the memory cells MC are erased in units of memory blocks, all memory cells MC of the memory block BLKc may be erased at the same time.

Figure 7:
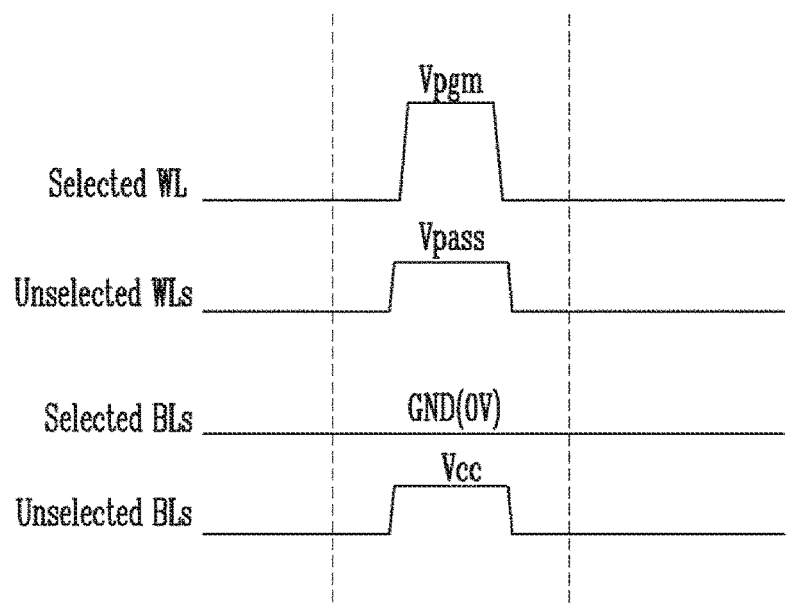
FIG. 7 is a diagram illustrating a voltage applied to word lines and bit lines during a program operation.

FIG. 7 is a diagram illustrating voltages applied to word lines and bit lines during a program operation.

Referring to FIG. 7, a program operation may include a plurality of program loops. A single program loop may include a program voltage applying process and a program verify process. FIG. 7 shows the program voltage applying process.

A program voltage Vpgm may be applied to a selected word line Selected WL. According to an embodiment, the program voltage Vpgm may be generated according to an incremental step pulse programming (ISPP) method. In other words, a level of the program voltage Vpgm may be gradually increased or decreased by a predetermined voltage increment as program loops are repeated. The numbers of program voltages Vpgm being applied in each program loop, voltage levels thereof, and voltage applying time may be controlled internally by the memory controller 200 of FIG. 1 or externally by the program operation control unit 140 of FIG. 1.

A pass voltage Vpass may be applied to unselected word lines Unselected WLs except the selected word line Selected WL. According to an embodiment, the pass voltages Vpass having the same voltage level may be applied to the unselected word lines Unselected WLs. According to an embodiment, the voltage level of the pass voltage Vpass may vary depending on the location of the word line.

A ground voltage GND (e.g., 0V) as a program permission voltage may be applied to selected bit lines Selected BLs coupled to a memory cell to be programmed.

A power voltage Vcc, which is a program inhibition voltage, may be applied to unselected bit lines Unselected BLs coupled to remaining memory cells except memory cells to be programmed.

Though not shown in FIG. 7, the memory device may apply a verify voltage Vverify to the selected word line Selected WL during the program verify process and a verify pass voltage Vverify_pass to the unselected word lines Unselected WLs. The memory device may sense a voltage or current which is output through bit lines coupled to the memory cells coupled to the selected word line Selected WL, and determine whether the program verify passes or fails based on the sensing result.

Figure 8:
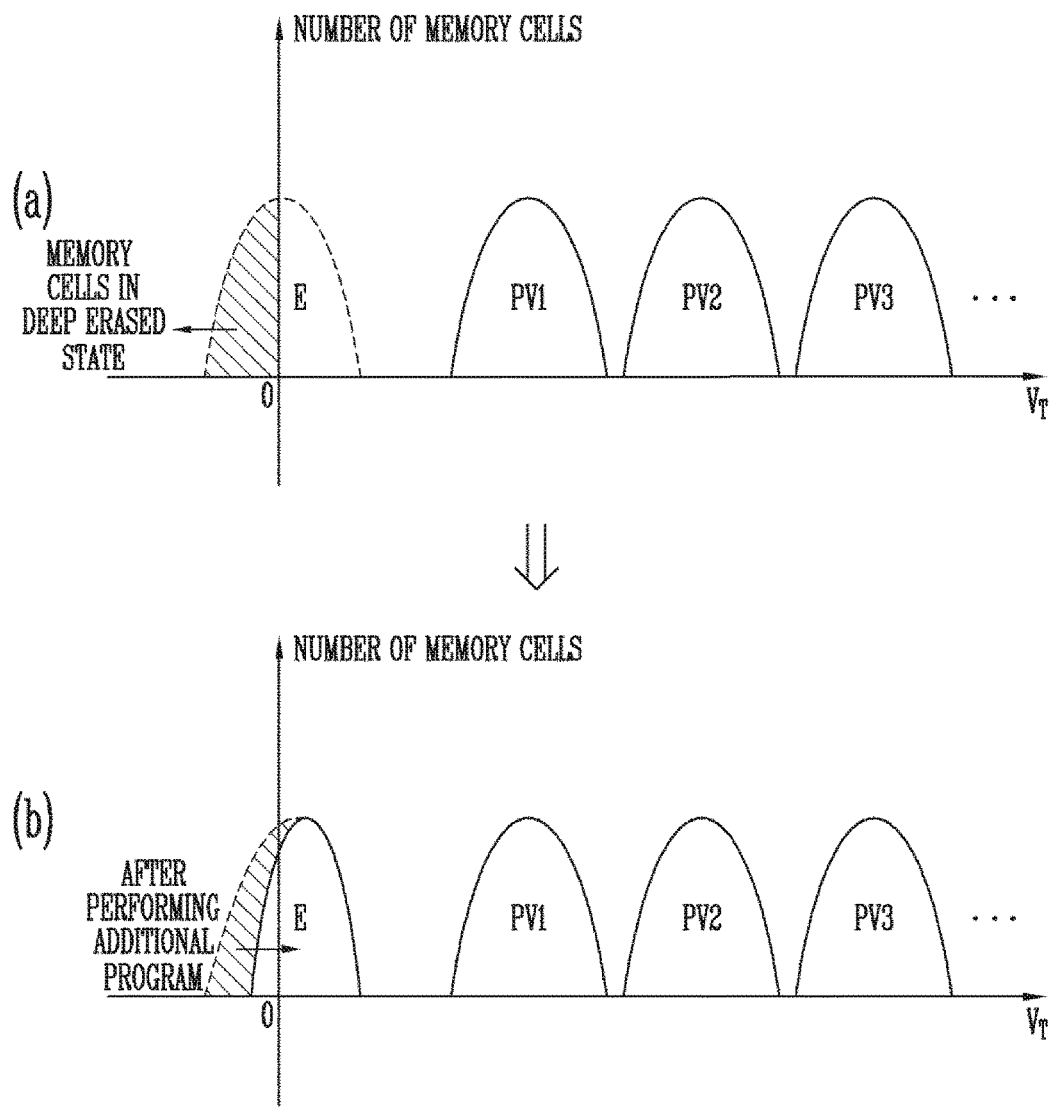
FIG. 8 is a diagram illustrating threshold voltage distribution of memory cells before and after an additional program operation.

FIG. 8 is a diagram illustrating threshold voltage distribution of memory cells before and after an additional program operation according to an embodiment.

Referring to FIG. 8, (a) is a diagram showing threshold voltage distribution of memory cells before an additional program operation is performed, and (b) is a diagram showing threshold voltage distribution of memory after an additional program operation is performed.

In (a) of FIG. 8, memory cells may be programmed to correspond to one of an erased state E and a plurality of program states PV1 to PV3 divided on the basis of a threshold voltage. However, some of the memory cells corresponding to the erased state E may be shown to have a threshold voltage corresponding to a deep erased state. The memory cells corresponding to the deep erased state may belong to the hatched region. When memory cells corresponding to a program state exist in a word line adjacent to the memory cells corresponding to the deep erased state, a lateral electric field in a channel direction may be increased. As a result, retention characteristics of the memory device may be deteriorated.

In (b) of FIG. 8, when the additional program operation according to an embodiment is performed, the memory cells corresponding to the deep erased state may be shown to have a threshold voltage corresponding to a normal erased state E.

Figure 9:
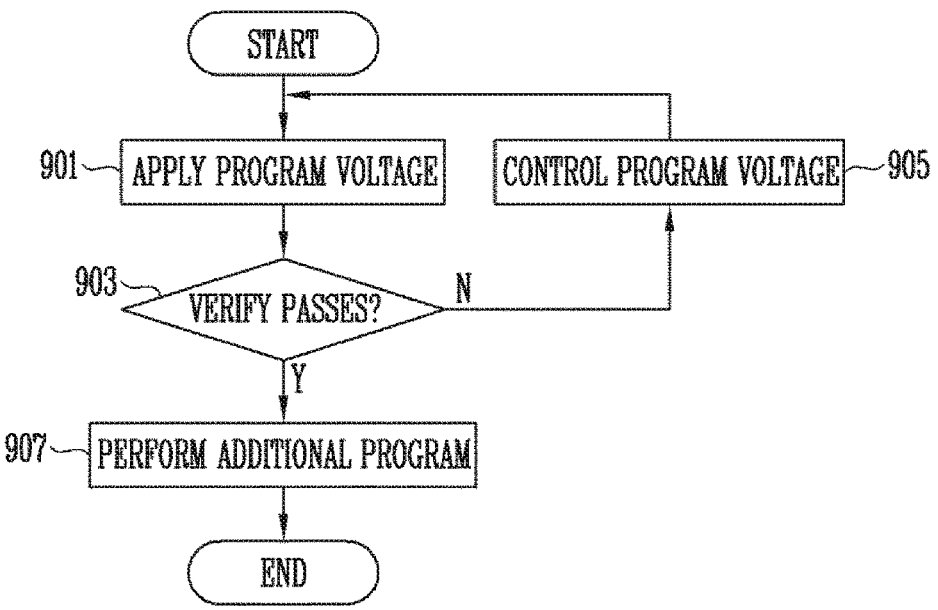
FIG. 9 is a flowchart illustrating a method of operating a memory device according to an embodiment.

FIG. 9 is a flowchart illustrating a method of operating a memory device according to an embodiment.

Referring to FIG. 9, at steps 901 to 905, the memory device may perform a program operation on a selected Nth page.

At step 901, the memory device may apply a program voltage to a selected Nth word line. More specifically, the memory device may apply a program voltage to the selected Nth word line and a pass voltage to unselected word lines. By applying the program voltage, a threshold voltage of memory cells coupled to the selected Nth word line may increase.

At step 903, the memory device may determine whether a verify operation passes or fails. More specifically, the memory device may apply a verify voltage to the selected Nth word line and a verify pass voltage to unselected word lines. The memory device may determine whether a verify operation of the memory cells coupled to the selected Nth word line fails or passes through bit lines coupled to the memory cells. When the verify operation passes, the process flow may proceed to step 907 and perform additional program operation on the selected Nth page. When the verify operation fails, the process flow may proceed to step 905 to control the program voltage. Steps 901 to 905 may form a single program loop. The memory cells may be programmed through a plurality of program loops. When the memory cells reach a target program state, the verify operation at step 903 passes.

At step 907, the memory device may perform an additional program operation on the selected Nth page when the program operation on the selected Nth page is completed. The additional program operation may be performed on memory cells having an erased state as a target program state. More specifically, the memory device may apply an additional program voltage to the selected Nth word line. According to an embodiment, the memory device may apply the additional program voltage to the selected Nth word line at least once.

Through the additional program operation, the memory cells having the threshold voltage corresponding to the deep erased state lower than the erased state may be programmed to have a threshold voltage corresponding to the erased state.

When the additional program voltage is applied to the selected Nth word line, the memory device may apply a program permission voltage (e.g., 0V) to bit lines coupled to memory cells having an erased state as a target program state, among the memory cells coupled to the selected word line, and a program inhibition voltage (e.g., power voltage) to bit lines coupled to memory cells having another program state, except the erased state, as a target program state. According to various embodiments, when the additional program voltage is applied to the selected Nth word line, the memory device may apply a program permission voltage to all bit lines coupled to the memory cells coupled to the selected Nth word line.

Figure 10:
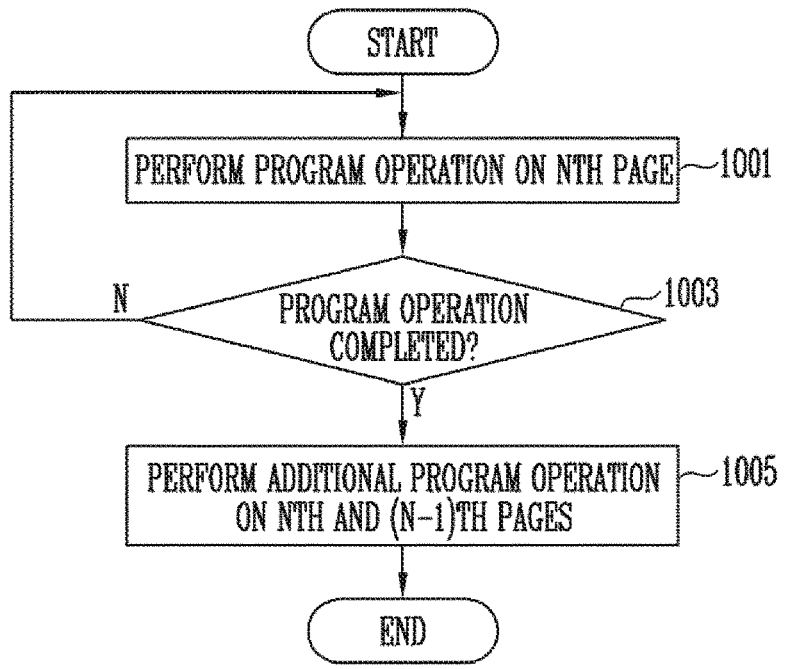
FIG. 10 is a flowchart illustrating a method of operating a memory device according to another embodiment.

FIG. 10 is a flowchart illustrating a method of operating a memory device according to another embodiment.

Referring to FIG. 10, the memory device may perform a program operation on a selected Nth page at steps 1001 through 1003.

Steps 1001 to 1003 may be performed in the same manner as steps 901 through 905 shown in FIG. 9. More specifically, when the verify operation at step 903 described with reference to FIG. 9 passes, the program operation at step 1003 may be completed.

In an embodiment of FIG. 10, when the program operation on the selected Nth page is completed, the memory device may perform additional program operations on the selected Nth page and the previous (N-1)th page programmed prior to the selected Nth page.

At step 1005, the memory device may simultaneously or sequentially perform the additional program operation on the selected Nth page and the previous (N-1)th page programmed prior to the selected Nth page.

When the memory device sequentially performs the additional program operation on the selected Nth page and the previous (N-1)th page programmed prior to the selected Nth page, for example, the memory device may apply an additional program voltage to the selected Nth word line. According to an embodiment, the memory device may apply the additional program voltage to the selected Nth word line. When the additional program voltage is applied to the selected Nth word line, the memory device may apply a program permission voltage (e.g., 0V) to bit lines coupled to memory cells having an erased state as a target program state, among the memory cells coupled to the selected word line, and a program inhibition voltage (e.g., power voltage) to bit lines coupled to memory cells having another program state, except for the erased state, as the target program state.

Subsequently, the memory device may perform the additional program operation on the previous (N-1)th page programmed prior to the selected Nth page. When the additional program voltage is applied to the previous (N-1)th word line, the memory device may apply a program permission voltage (e.g., 0V) to bit lines coupled to memory cells having an erased state as a target program state, among memory cells coupled to the previous (N-1)th word line, and a program inhibition voltage (e.g., power voltage) to bit lines coupled to memory cells having another program state, except for the erased state, as a target program state.

According to various embodiments, the additional program operation on the previous (N-1)th page programmed prior to the selected Nth page may be performed before the additional program operation on the selected Nth page is performed.

According to an embodiment, when the memory device performs the additional program operations on the selected Nth page and the previous (N−1)th page programmed prior to the selected Nth page, the additional program voltage may be applied to the selected Nth word line and the previous (N−1)th word line. The memory device may apply the program permission voltage to all bit lines coupled to the selected Nth word line and the previous (N−1)th word line.

FIG. 11 is a flowchart illustrating a method of operating a memory device according to another embodiment.

Referring to FIG. 11, the memory device may perform a program operation on the selected Nth page at steps 1101 through 1103.

Steps 1101 to 1103 may be performed in the same manner as steps 901 through 905 shown in FIG. 9. More specifically, it may be considered that the program operation at step 1103 is completed when the verify operation at step 903 shown in FIG. 9 passes.

In the embodiment shown in FIG. 11, the memory device may perform additional program operations on a selected Nth page, a previous (N−1)th page programmed prior to a selected Nth page, and a next (N+1)th page to be programmed subsequent to the selected Nth page when the program operation of the selected Nth page is completed.

At step 1105, the memory device may simultaneously or sequentially perform additional program operations on the selected Nth page, the previous (N−1)th page programmed prior to the selected Nth page, and the next (N+1)th page to be programmed subsequent to the selected Nth page.

When the additional program operations are sequentially performed on the selected Nth page, the previous (N−1)th page programmed prior to the selected Nth page and the next (N+1)th page to be programmed subsequent to the selected Nth page, for example, the memory device may apply an additional program voltage to the selected Nth word line. According to an embodiment, the memory device may apply the additional program voltage to the selected Nth word line at least once. The memory device may apply a program permission voltage (e.g., 0V) to bit lines coupled to memory cells having an erased state as a target program state, among memory cells coupled to the selected word line, and a program inhibition voltage (e.g., power voltage) to bit lines coupled to memory cells having another program state, except the erased state, as a target program state when the additional program voltage is applied to the selected Nth word line.

Subsequently, the memory device may perform an additional program operation on the previous (N−1)th page programmed prior to the selected Nth page. The memory device may apply the program permission voltage (e.g., 0V) to bit lines coupled to memory cells having an erased state as a target program state, among memory cells coupled to the previous (N−1)th word line, and the program inhibition voltage (e.g., power voltage) to bit lines coupled to memory cells having another program state, except for the erased state, as a target program state when the additional program voltage is applied to the previous word line (N−1)th word line.

Subsequently, the memory device may perform an additional program operation on the next (N+1)th page to be programmed subsequent to the selected Nth page. The memory device may apply the program permission voltage (e.g., 0V) to bit lines coupled to memory cells having an erased state as a target program state, among memory cells coupled to the next (N+1)th word line, and the program inhibition voltage (e.g., power voltage) to bit lines coupled to memory cells having another program state, except for the erased state, as a target program state when the additional program voltage is applied to the next (N+1)th word line.

According to various embodiments, the additional program operations on the selected Nth page, the previous (N−1)th page programmed prior to the selected Nth page, and the next (N+1)th page to be programmed subsequent to the selected Nth page may be performed sequentially or randomly, regardless of order of the pages.

According to an embodiment, when the memory device simultaneously performs the additional program operations on the selected Nth page, the previous (N−1)th page programmed prior to the selected Nth page, and the next (N+1)th page to be programmed subsequent to the selected Nth page, the memory device may simultaneously apply the additional program voltage to the selected Nth word line, the previous (N−1)th word line, and the next (N+1)th word line. The memory device may apply a program permission voltage to all bit lines coupled to the memory cells coupled to the selected Nth word line, the previous (N−1)th word line, and the next (N+1)th word line.

FIG. 12 is a flowchart illustrating a method of operating a memory device according to another embodiment.

Referring to FIG. 12, steps 1201 to 1203 may be performed in the same manner as steps 1001 to 1003 shown in FIG. 10, and step 1207 may be performed in the same manner as step 1005 shown in FIG. 10.

The embodiment shown in FIG. 12 may be different from that of FIG. 10 in that at step 1205, an operation of determining whether memory cells having a deep erased state exist may be additionally performed and an additional program operation is selectively performed at step 1207 according to the result in step 1205.

At step 1205, the memory device may additionally perform a verify operation to determine whether the memory cells having the deep erased state exist after the program operation of the selected Nth page is performed at step 1203 before the additional program operation is performed at step 1207.

During a verify operation, the deep erase verify voltage Vdeep_verify may be applied to the selected Nth word line and the previous (N−1)th word line. According to a verify result, the memory device may perform an additional program operation only when the memory cells corresponding to the deep erased state exist.

Figure 13:
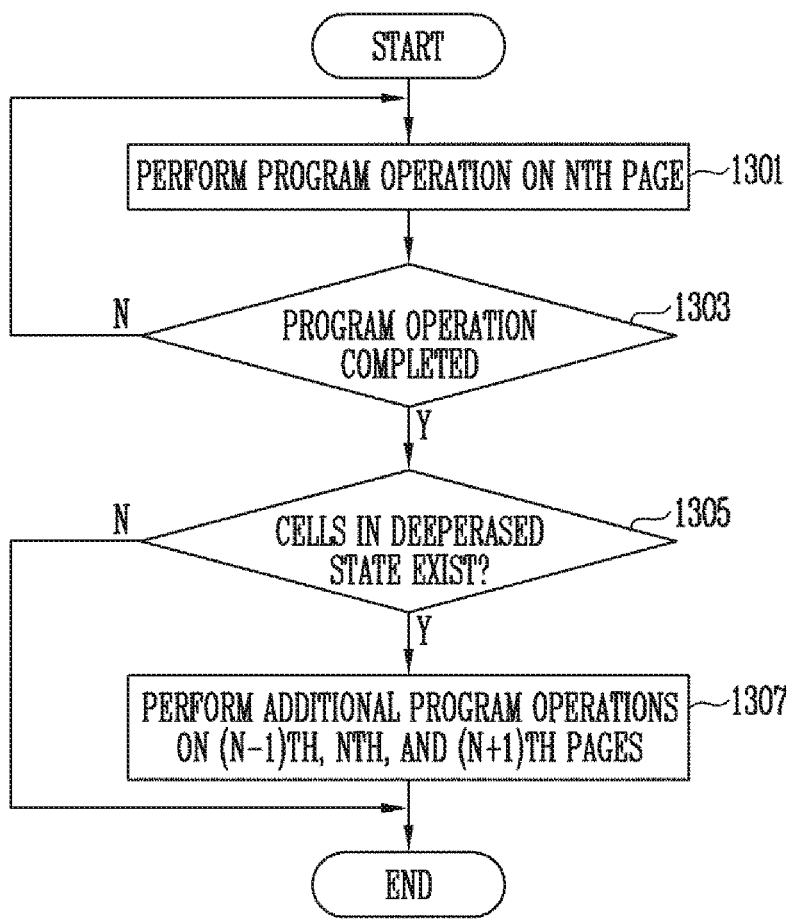
FIG. 13 is a flowchart illustrating a method of operating a memory device according to another embodiment.

FIG. 13 is a flowchart illustrating a method of operating a memory device according to another embodiment.

Steps 1301 to 1303 may be performed in the same manner as steps 1101 to 1103 shown in FIG. 11, and step 1307 may be performed in the same manner as step 1105 shown in FIG. 11. Therefore, the operating method of the embodiment shown in FIG. 13 will be described based on the descriptions made with reference to FIG. 11.

The embodiment of FIG. 13 may be different from the embodiment of FIG. 11 in that at step 1305, it is determined whether memory cells having a deep erased state exist before an additional program operation at step 1307 is performed, and as a result of determination, the additional program operation may be selectively performed.

At step 1305, the memory device may additionally perform a verify operation to determine whether the memory cells corresponding to the deep erased state exist before the additional program operation at step 1307 after a program operation of the selected Nth page is completed at step 1303.

During a verify operation, the deep erase verify voltage Vdeep_verify may be applied to the selected Nth word line, the previous (N−1)th word line, and the next (N+1)th word line. According to a verify result, the memory device may perform an additional program operation only when the memory cells corresponding to the deep erased state exist.

Figure 14:
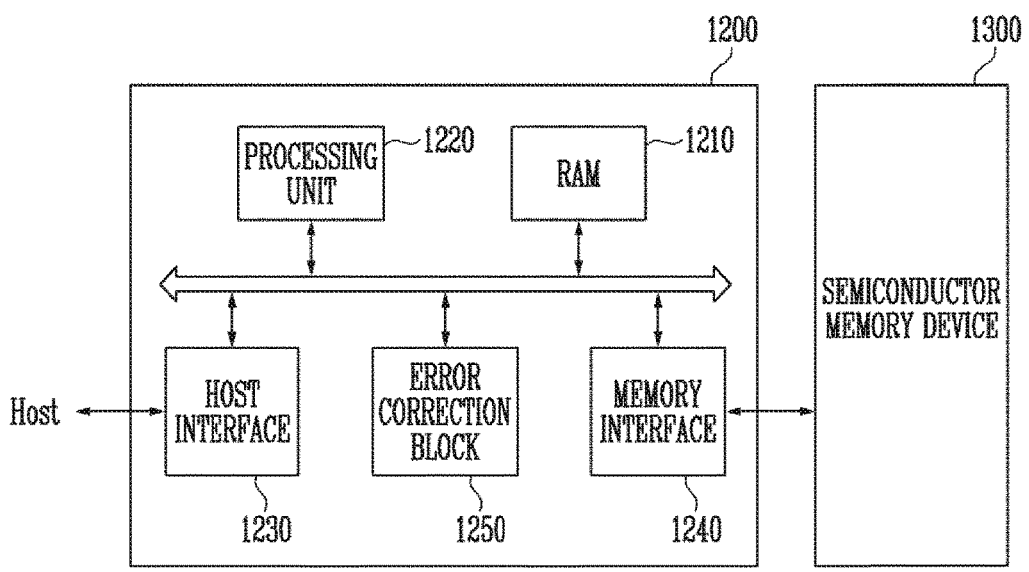
FIG. 14 is a block diagram illustrating another embodiment of a storage device shown in FIG. 1.

FIG. 14 is a block diagram illustrating another embodiment of a storage device 50 shown in FIG. 1.

Referring to FIG. 14, a storage device 1000 may include a semiconductor memory device 1300 and a controller 1200.

The semiconductor memory device 1300 may be configured and operated in substantially the same manner as the semiconductor memory device 100 described above with reference to FIG. 1. The controller 1200 may be configured and operated in substantially the same manner as the memory controller 200 described above with reference to FIG. 1. Thus, a detailed description thereof will be omitted.

The controller 1200 may be coupled to a host and the semiconductor memory device 1300. The controller 1200 may access the semiconductor memory device 1300 at the request of the host. For example, the controller 1200 may control a read operation, a program operation, an erase operation, and/or a background operation of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processing unit 1220, a host interface 1230, a memory interface 1240, and an error correction block 1250.

The RAM 1210 may be used as an operation memory of the processing unit 1220, a cache memory between the semiconductor memory device 1300 and the host, and/or a buffer memory between the semiconductor memory device 1300 and the host.

The processing unit 1220 may control operations of the controller 1200. The processing unit may control a read operation, a program operation, an erase operation, and background operations of the semiconductor memory device 1000. The processing unit 1220 may operate firmware to control the semiconductor memory device 1300. According to an embodiment, the processing unit 1220 may function as a flash translation layer FTL. The processing unit 1220 may translate a logical block address LBA provided by the host into a physical block address PBA through the flash translation layer FTL. The flash translation layer FTL may receive the logical block address LBA by using a mapping table and translate the logical block address LBA into the physical block address PBA. There may be various address mapping methods for the flash translation layer according to a mapping unit. Examples of these address mapping methods may include a page mapping method, a block mapping method, and a hybrid mapping method.

The processing unit 1220 may randomize data received from the host. For example, the processing unit 1220 may randomize the data received from the host by using a randomizing seed. The randomized data may be provided to the semiconductor memory device 1300, so that the memory cell array may be programmed with the randomized data.

The processing unit 1220 may also derandomize the data from the semiconductor memory device 1300 during a read operation. For example, the processing unit 1220 may derandomize the data received from the semiconductor memory device 1300 by using a derandomizing seed. The derandomized data may be output to the host.

According to an embodiment, the processing unit 1220 may perform randomizing and derandomizing operations by driving software or firmware.

The host interface 1230 may include a protocol for data exchange between the host and the controller 1200. According to an embodiment, the controller 1200 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 1300. For example, the memory interface 1240 may include a NAND flash interface or a NOR flash interface.

The error correction code circuit 1250 may detect and correct an error in data received from the semiconductor memory device 1300 by using an error correction code (ECC). In addition, the error correction code circuit 1250 may correct an error in the read page data by using the error correction code (ECC). The error correction code circuit 1250 may correct an error by using coded modulation, such as low density parity check (LDPC) code, Bose-Chaudhuri-Hocquenghem code (BCH) code, turbo code, Reed-Solomon code, convolution code, recursive systematic code (RSC), trellis-coded modulation (TCM), block coded modulation (BCM), and hamming code.

The controller 1200 and the semiconductor memory device 1300 may be integrated in one semiconductor device. According to an embodiment, the controller 1200 and the semiconductor memory device 1300 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1200 and the semiconductor memory device 1300 may be integrated in a single semiconductor device to form a solid state drive (SSD). The SSD may include a storage device for storing data in a semiconductor memory device. When the storage device 1000 is used as an SSD, operational rates of the host coupled to the storage device 1000 may be significantly improved.

In another example, the storage device 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 1300 or the storage device 1000 may be packaged in various forms. For example, the semiconductor memory device 1300 or the storage device 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 15:
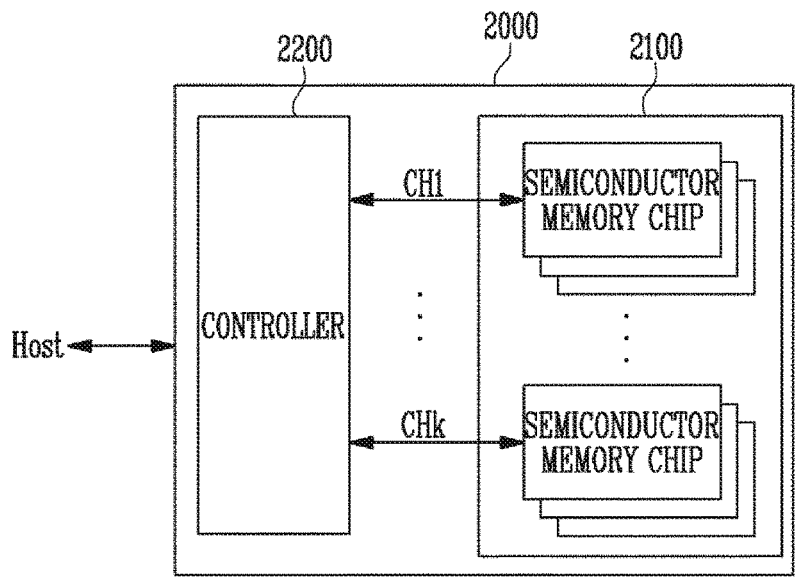
FIG. 15 is a block diagram illustrating an application example of a storage device shown in FIG. 14.

FIG. 15 is a block diagram illustrating an exemplary application of the storage device 1000 shown in FIG. 14.

Referring to FIG. 15, a storage device 2000 may include a semiconductor memory device 2100 and a controller 2200. The semiconductor memory device 2100 may include semiconductor memory chips. The semiconductor memory chips may be divided into groups.

FIG. 15 illustrates the groups communicating with the controller 2200 through first to k-th channels CH1 to CHk. Each of the semiconductor memory chips may be configured and operated in substantially the same manner as the semiconductor memory device 100 described above with reference to FIGS. 1 and 2.

Each group may communicate with the controller 2200 through a single common channel. The controller 2200 may be configured in substantially the same manner as the controller 1200 described with reference to FIG. 10, and may control the plurality of memory chips of the semiconductor memory device 2100 through the plurality of channels CH1 to CHk.

As illustrated in FIG. 15, a plurality of semiconductor memory chips may be coupled to a single channel. However, the storage device 2000 may be modified so that a single semiconductor memory chip may be coupled to a single channel.

Figure 16:
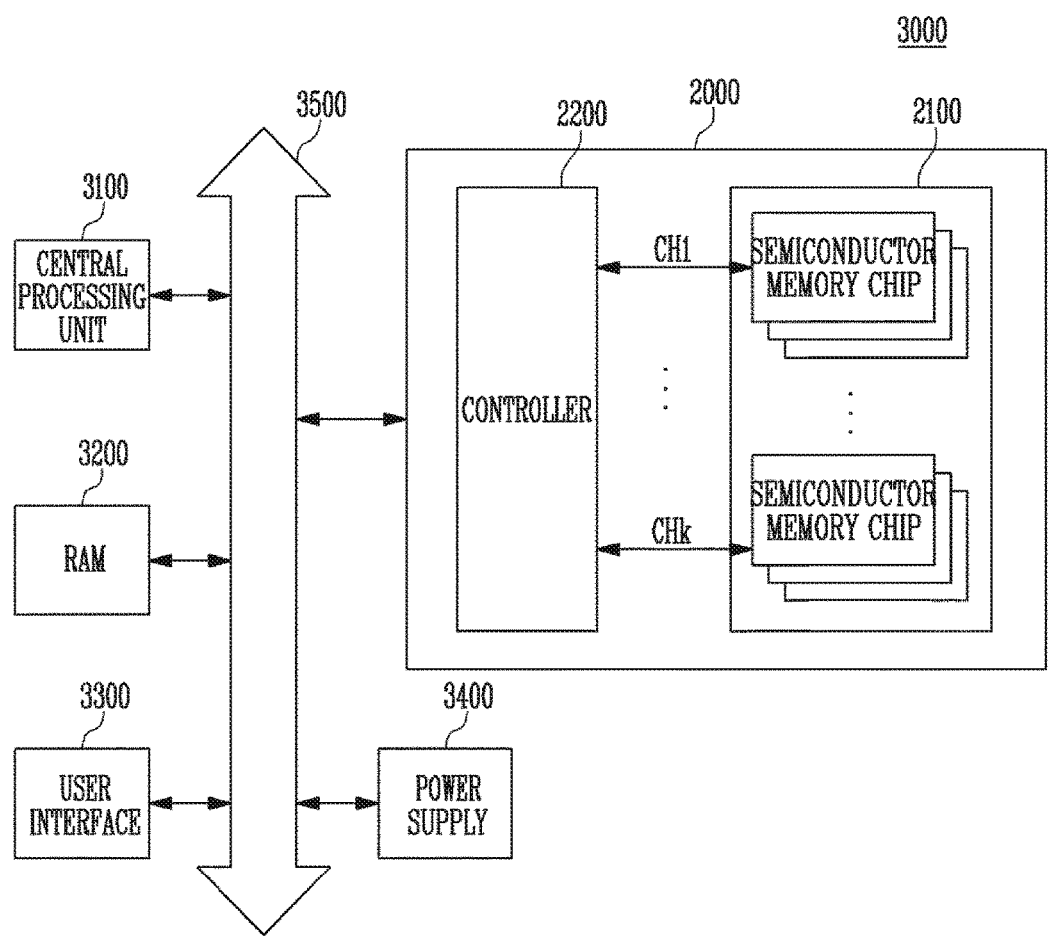
FIG. 16 is a block diagram illustrating a computing system including a storage device described with reference to FIG. 15.

FIG. 16 is a block diagram illustrating a computing system 3000 having the storage device 2000 described above with reference to FIG. 15.

Referring to FIG. 16, the computing system 3000 may include a central processing unit 3100, a random access memory (RAM) 3200, a user interface 3300, a power supply 3400, a system bus 3500, and the storage device 2000.

The storage device 2000 may be electrically connected to the central processing unit 3100, the RAM 3200, the user interface 3300 and the power supply 3400 through the system bus 3500. Data provided through the user interface 3300 or processed by the central processing unit 3100 may be stored in the storage device 2000.

As shown in FIG. 16, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 16, the storage device 2000 shown in FIG. 15 may be provided as the memory system 3000. However, the storage device 2000 may be replaced by the storage device 1000 shown in FIG. 14. According to an embodiment, the computing system 3000 may include both of the memory systems 1000 and 2000 described above with reference to FIGS. 14 and 15.

According to embodiments of the invention, a memory device having improved reliability and an operating method thereof may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory device, comprising:
   a memory cell array including a plurality of memory cells;
   a peripheral circuit performing a program operation on selected memory cells among the plurality of memory cells; and
   a control logic controlling the peripheral circuit to perform an additional program operation on memory cells corresponding to a deep erased state where the memory cells has a threshold voltage having a lower voltage level than a threshold voltage of an erase state, among the selected memory cells, after the program operation is completed.

2. The memory device of claim 1, wherein the control logic includes a program operation control unit controlling the peripheral circuit to apply an additional program voltage to a selected word line coupled to the selected memory cells so that the threshold voltage of the memory cells corresponding to the deep erased state is increased to the threshold voltage corresponding to the erase state during the additional program operation.

3. The memory device of claim 2, wherein the program operation control unit controls the peripheral circuit to apply the additional program voltage to the selected word line several times during the additional program operation.

4. The memory device of claim 2, wherein the peripheral circuit includes a voltage generator generating the additional program voltage.

5. The memory device of claim 1, wherein the control logic controls the peripheral circuit to determine whether the memory cells corresponding to the deep erased state exist, among the selected memory cells, after the program operation is completed, and performs the additional program operation thereon when the memory cells corresponding to the deep erased state exist.

6. A memory device, comprising:
   a memory cell array including a plurality of memory cells divided into a plurality of pages;
   a peripheral circuit performing a program operation on a selected page, among the plurality of pages; and
   a program operation control unit controlling the peripheral circuit to perform an additional program operation on memory cells corresponding to a deep erased state where the memory cells have a threshold voltage having a lower voltage level than a threshold voltage corresponding to an erase state, the memory cells included in at least one of the plurality of pages, after the program operation is completed.

7. The memory device of claim 6, wherein the program operation control unit controls the peripheral circuit to perform an additional program operation on the memory cells corresponding to the deep erased state included in the selected page when the program operation of the selected page is completed.

8. The memory device of claim 7, wherein the program operation control unit determines whether the memory cells corresponding to the deep erased state are included in the selected page, and performs the additional program operation thereon according to a result of determination.

9. The memory device of claim 6, wherein the program operation control unit controls the peripheral circuit to simultaneously or sequentially perform additional program operations on the selected page and a previous page programmed prior to the selected page when the program operation of the selected page is completed.

10. The memory device of claim 9, wherein the program operation control unit determines whether the memory cells corresponding to the deep erased state are included in the selected page and the previous page, and performs the additional program operations according to a result of determination.

11. The memory device of claim 6, wherein the program operation control unit controls the peripheral circuit to simultaneously or sequentially perform additional program operations on the selected page, the previous page programmed prior to the selected page, and a next page to be programmed subsequent to the selected page when the program operation of the selected page is completed.

12. The memory device of claim 11, wherein the program operation control unit determines whether the memory cells corresponding to the deep erased state are included in the selected page, the previous page and the next page, and performs the additional program operations thereon according to a result of determination.

13. The memory device of claim 6, wherein the program operation control unit controls the peripheral circuit to apply an additional program voltage to a page on which the additional program operations are performed, among the plurality of pages, at least once during the additional program operation.

14. The memory device of claim 13, wherein the additional program voltage is applied to increase the threshold voltage of the memory cells corresponding to the deep erased state to the erase state.

15. The memory device of claim 14, wherein the peripheral circuit includes a voltage generator generating the additional program voltage.

16. A method of operating a memory device, the method comprising:
performing a program operation on memory cells included in a selected page, among a plurality of memory cells forming a plurality of pages; and
performing an additional program operation on memory cells corresponding to a deep erased state where the memory cells have a lower threshold voltage than an erase state, the memory cells included in at least one of the plurality of pages, after the program operation is completed.

17. The method of claim 16, wherein the performing of the additional program operation comprises:
determining whether the memory cells corresponding to the deep erased state are included in the selected page and a previous page programmed prior to the selected page; and
supplying an additional program voltage to the selected page and the previous page to increase the threshold voltage of the memory cells corresponding to the deep erased state to the erase state when the memory cells corresponding to the deep erased state are included in the selected page and the previous page.

18. The method of claim 16, wherein the performing of the additional program operation comprises:
determining whether the memory cells corresponding to the deep erased state are included in the selected page, the previous page programmed prior to the selected page, and a next page to be programmed subsequent to the selected page; and
supplying an additional program voltage to the selected page, the previous page and the next page to increase the threshold voltage of the memory cells corresponding to the deep erased state to the erase state when the memory cells corresponding to the deep erased state are included in the selected page, the previous page and the next page.

* * * * *